(12) United States Patent
Brownson et al.

(10) Patent No.: US 7,851,340 B2
(45) Date of Patent: *Dec. 14, 2010

(54) SEMICONDUCTOR FIN INTEGRATION USING A SACRIFICIAL FIN

(75) Inventors: Rickey S. Brownson, Cedar Park, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 582 days.

This patent is subject to a terminal disclaimer.

(21) Appl. No.: 11/678,322

(22) Filed: Feb. 23, 2007

(65) Prior Publication Data

US 2008/0206933 A1 Aug. 28, 2008

(51) Int. Cl.
*H01L 21/3205* (2006.01)
*H01L 21/4763* (2006.01)

(52) U.S. Cl. .................. 438/585; 438/151; 438/157; 257/E21.409

(58) Field of Classification Search .................. 438/151, 438/157, 283, 284, 585, 639, 696; 257/365, 257/368, 401, 525, 526, E21.409, E29.137, 257/E29.151
See application file for complete search history.

(56) References Cited

U.S. PATENT DOCUMENTS 6,222,259 B1 4/2001 Park et al.
2005/0048727 A1 3/2005 Maszara et al.
2005/0087811 A1 * 4/2005 Liao et al. .................. 257/368

* cited by examiner

*Primary Examiner*—Charles D Garber
*Assistant Examiner*—Abdulfattah Mustapha
(74) *Attorney, Agent, or Firm*—James L. Clingan, Jr.; Robert A. Rodriguez

(57) ABSTRACT

There is a method for forming a semiconductor device. Portions of a sacrificial layer are removed to expose a first seed layer region. The first seed layer region corresponds to a first semiconductor region, and a remaining portion of the sacrificial layer corresponds to a second semiconductor region. An epitaxial semiconductor material is deposited over the first seed layer region. A capping layer is formed to overlie the epitaxial semiconductor material and the remaining portion of the sacrificial layer. Portions of the capping layer are removed to form a capping structure that overlies a part of the remaining portion of the sacrificial layer. Portions of the sacrificial layer not covered by the capping structure are removed to form a sacrificial structure having sidewalls. Fin structures are formed adjoining the sidewalls by depositing a semiconductor material along the sidewalls. Portions of the capping structure are removed to expose portions of sacrificial layer between adjacent fin structures. Portions of the sacrificial material between the adjacent fin structures are removed.

20 Claims, 10 Drawing Sheets

US 7,851,340 B2

SEMICONDUCTOR FIN INTEGRATION USING A SACRIFICIAL FIN

RELATED APPLICATIONS

This application is related to U.S. patent application Ser. No. 11/678,327, titled "Forming Semiconductor Fins Using a Sacrificial Fin," filed Feb. 23, 2007, filed by the inventors hereof, and assigned to the assignee hereof.

BACKGROUND

1. Field

This disclosure relates generally to forming semiconductor fins for use in making semiconductor devices, and more specifically, to forming the semiconductor fins using a sacrificial fin.

2. Related Art

The use of semiconductor fins in making semiconductor devices provides advantages over planar semiconductor devices. Transistors having a fin for the channel can be made to have lower leakage and higher drive because the gate, being on two sides of the channel, has more control of the channel. One of the desires generally relevant to semiconductor devices, including those using semiconductor fins, is to increase the density; to increase the number of devices in a given area. In the case of semiconductor fins, the minimum fins spacing is lithographically limited. Transistors using fins, however, are not expected to fit all of the requirements of an integrated circuit design. Thus, one issue is integrating the fins with planar transistors while improving density.

Thus, there is a need to improve the density of semiconductor devices using fins while also having desirable electrical characteristics, and a further desire is to efficiently integrate semiconductor fins with planar transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a sacrificial silicon germanium (SiGe) layer is formed over a silicon seed layer. A nitride capping layer is formed over the SiGe layer. A sacrificial fin is formed from the sacrificial SiGe layer so that the SiGe fin is on a portion of the silicon seed layer. Epitaxial silicon is grown on the sides of the SiGe fin. The reduction or elimination of facets provides for more control of the silicon width. The SiGe fin is removed leaving two silicon fins that are then used in transistor formation. This is better understood by reference to the drawings in the following description.

Figure 1:
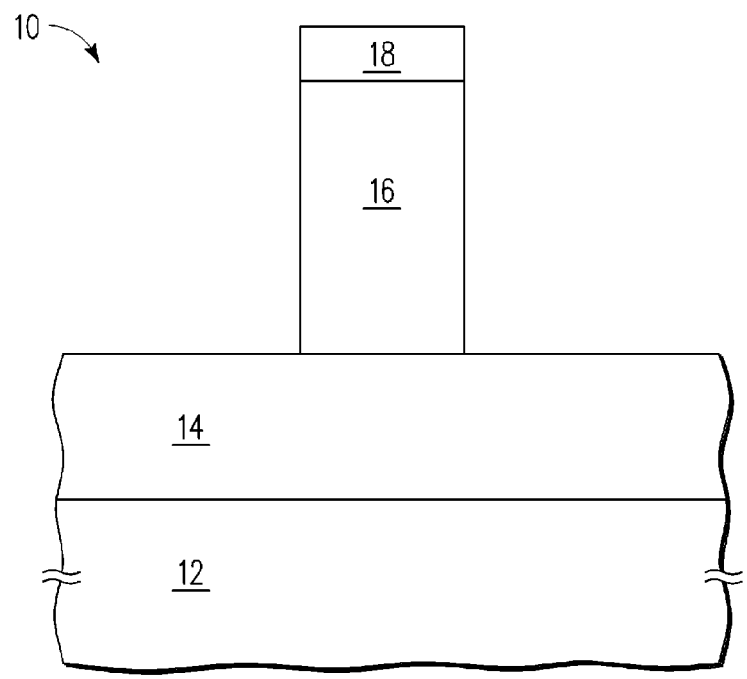
FIG. 1 is a cross section of a semiconductor device at a stage in processing according to an embodiment of the invention.

Shown in FIG. 1 is semiconductor device 10 comprising a substrate 12, an insulating layer 14, a silicon germanium (SiGe) fin 16 over insulating layer 14, and a capping layer 18 over SiGe fin 16. Substrate 12 and insulating layer 14 and SiGe fin 16 may be formed from a semiconductor-on-insulator (SOI) substrate in which the overlying semiconductor layer is SiGe. Substrate 12 can be considered a handle wafer portion because it provides structural support. In this case SiGe fin 16 may be about 100 nanometers (nm) in height. Capping layer 18 and SiGe fin 16 arise from forming a SiGe layer over insulating layer 14 and another layer, preferably nitride in this example, over the SiGe layer. The nitride layer is patterned and the SiGe is then patterned as well. The width of SiGe fin 16 is preferably the smallest that can be achieved by the lithography that is available but could be another width. SiGe fin 16 is the length that is desired for the fin transistor to be formed in silicon using SiGe fin 16. At the end of this length, not shown but conventional for fins, is a source/drain region that is also elevated at the same height as SiGe fin 16. This source/drain is also covered with the nitride.

Figure 2:
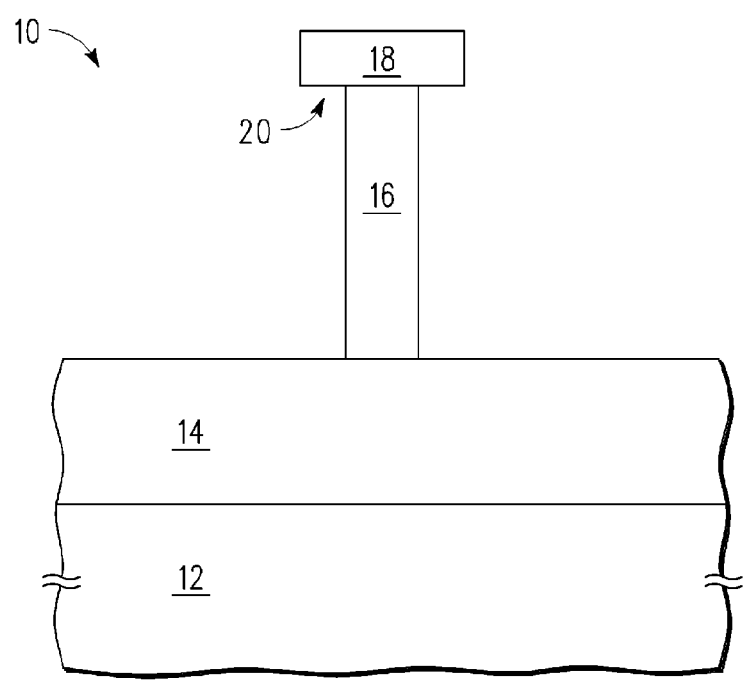
FIG. 2 is a cross section of the semiconductor device of FIG. 1 at a subsequent stage in processing.

Shown in FIG. 2 is semiconductor device 10 after trimming SiGe fin 16 which results in an overhang 20 where nitride layer 18 extends past the sides of trimmed SiGe fin 16. Preferably the overhang is about a fourth of the width of SiGe fin 16 of FIG. 1. Thus for an overhang on both sides of SiGe fin 16, trimming reduces the width in half to achieve the 25% overhang of overhang 20. Trimming is a well known process for silicon gates. Trimming processes, such as those used for trimming polysilicon gates, may be used with the corresponding adjustment in chemistry to account for the trimming being of SiGe instead of silicon. One such method is to oxidize along the sides and remove the resulting oxide. Another is to apply an isotropic etch.

Figure 3:
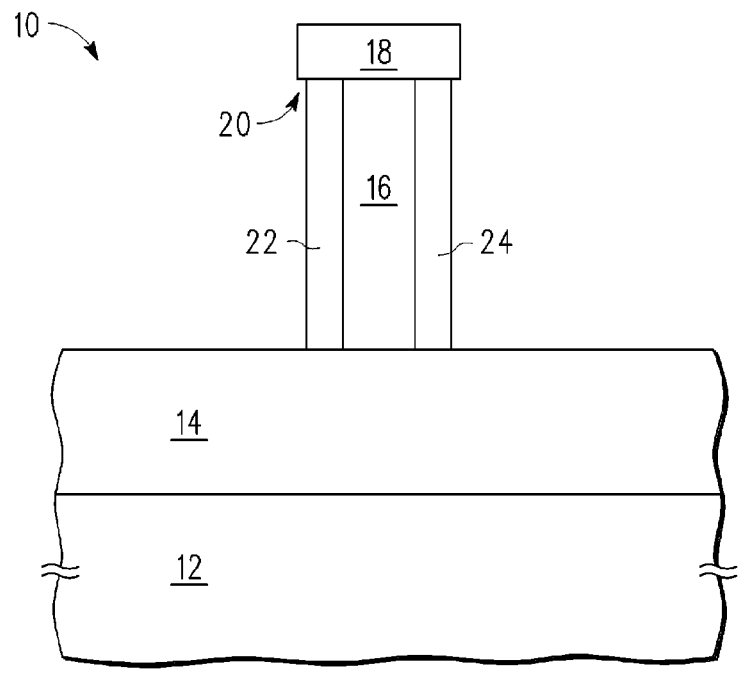
FIG. 3 is a cross section of the semiconductor device of FIG. 2 at a subsequent stage in processing.

Shown in FIG. 3 is semiconductor device 10 after epitaxially growing a silicon fin 22 on one sidewall of SiGe fin 16 and a silicon fin 24 on the other side of SiGe fin 16. Silicon fins 22 and 24 have a width a little less than the amount of the overhang of overhang 20. Thus, silicon fins 22 and 24 are less than 25% of the width of SiGe fin 16. Thus about 20% of the width of SiGe fin 16 is achievable. The result is that for every sacrificial SiGe fin, there are two silicon fins. The width of sacrificial SiGe fin 16 is of a width to achieve the desired width and spacing of silicon fins 22 and 24. The spacing of the SiGe fins is preferably the minimum spacing. Thus if the SiGe fins are at the minimum spacing or repeat distance, also commonly called minimum pitch, the density is doubled from what the minimum pitch would normally provide by having two silicon fins per sacrificial SiGe fin.

Figure 4:
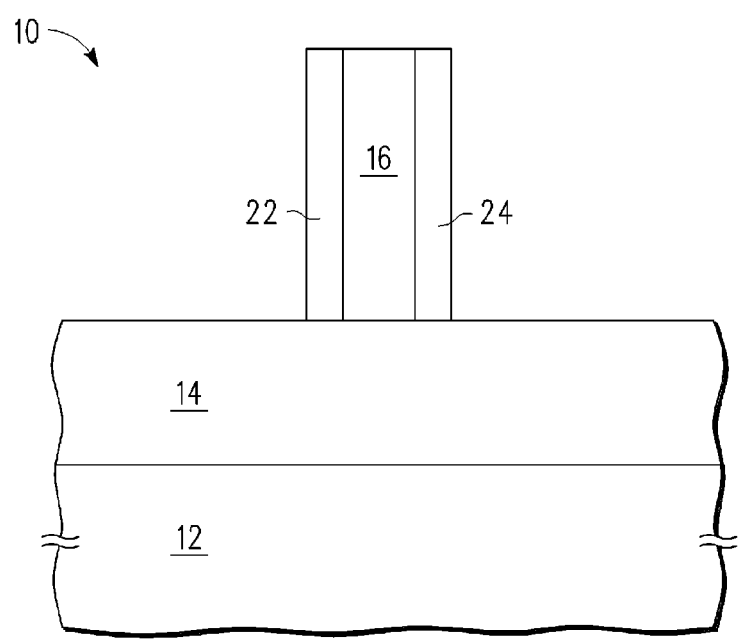
FIG. 4 is a cross section of the semiconductor device of FIG. 3 at a subsequent stage in processing.

Shown in FIG. 4 is semiconductor device 10 after removing capping layer 18 shown in FIG. 3. The portions of capping layer 18 over the SiGe source/drain regions, which are not shown in the FIGS. are not removed at this step. This has the affect of exposing SiGe fin 16.

Figure 5:
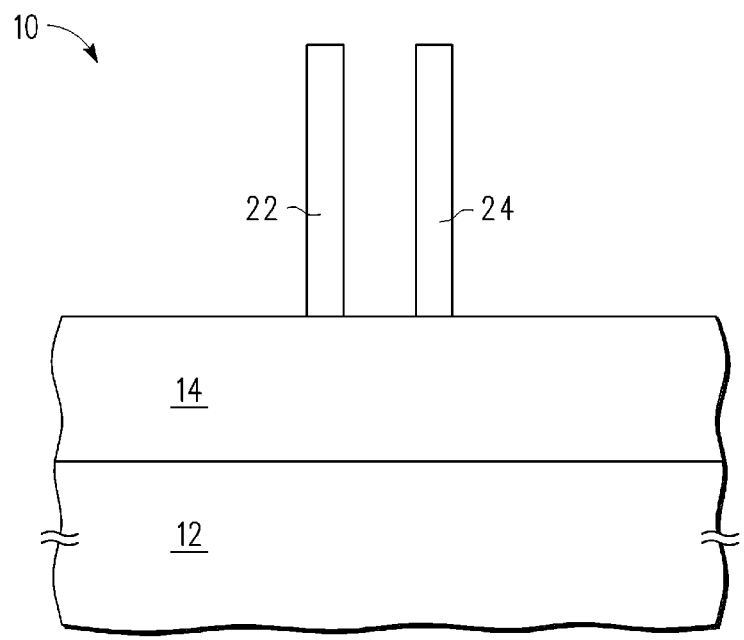
FIG. 5 is a cross section of the semiconductor device of FIG. 4 at a subsequent stage in processing.

Shown in FIG. 5 is semiconductor device 10 after removing SiGe fin 16. This leaves silicon fins 22 and 24 standing alone. There are etch chemistries that are selective between SiGe and silicon. One such chemistry is thermal gaseous HCl. Other selective etches include plasma fluorine chemistries or peroxide wet etches. Capping layer 18 over the SiGe source/drain regions may be removed after removing SiGe fin 16.

Figure 6:
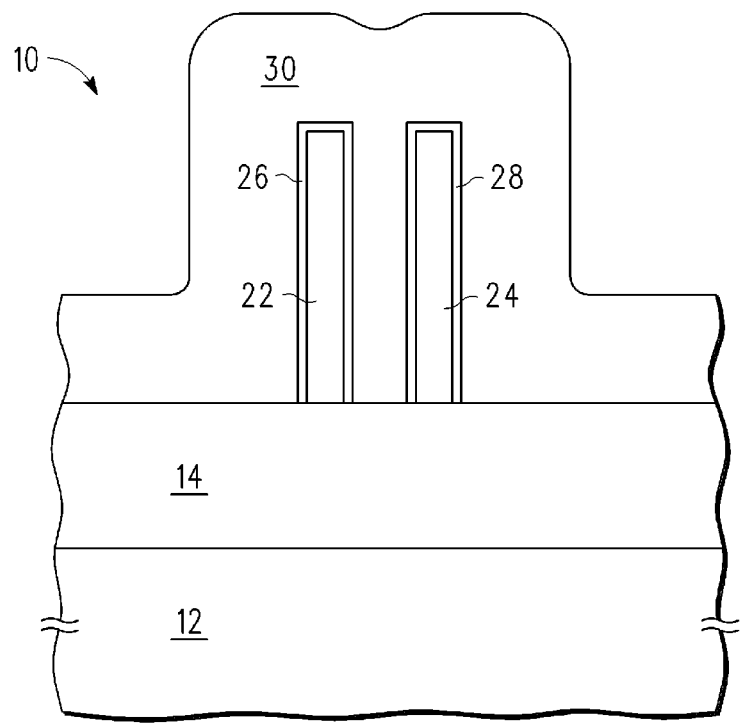
FIG. 6 is a cross section of the semiconductor device of FIG. 5 at a subsequent stage in processing.

Shown in FIG. 6 is semiconductor device 10 after forming a gate dielectric 26 on silicon fin 22, a gate dielectric 28 on semiconductor fin 24, and a polysilicon layer 30 on silicon fins 22 and 24. Gate dielectric 26 and gate dielectric 28 in this example are thermal oxides which may be grown in a typical fashion for gate dielectrics. An alternative would be to provide a high k gate dielectric such as hafnium oxide. In such case the gate dielectric would be deposited and would then be on the surface of insulating layer 14. Polysilicon layer 30 would be patterned and used as a gate. The view in FIG. 6 is unchanged by patterning polysilicon layer 30.

Thus it is seen that fins can be made using a sacrificial SiGe fin to grow sub-lithographic silicon fins. With the trimming of the SiGe fin, there is left an overhang of an overlying capping layer. The overhang of the overlying capping layer constrains the epitaxial silicon growth to occur in one direction only so that facets do not occur or at least are significantly reduced. Thus fins 22 and 24 have thicknesses that are substantially uniform and have a well controlled width.

Figure 7:
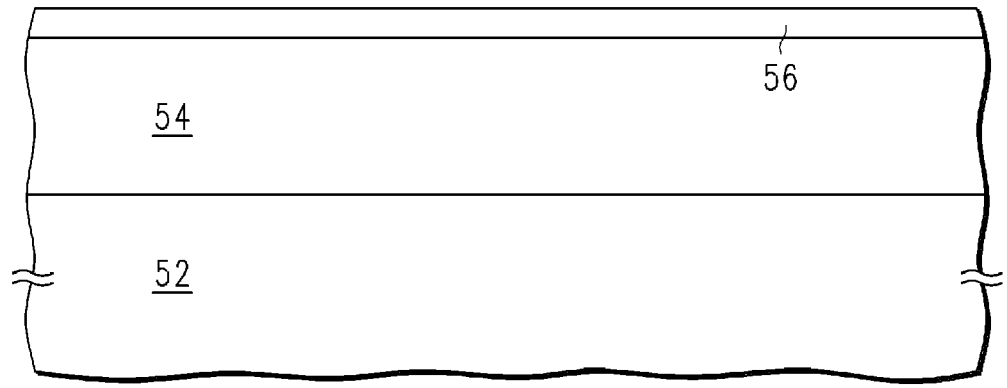
FIG. 7 is a cross section of a semiconductor device at a stage in processing according to another embodiment of the invention.

Shown in FIG. 7 is a semiconductor device 50 comprising a substrate 52 (handle wafer portion), an insulating layer 54 over substrate 52, and a silicon layer 56 over the insulating layer. This is similar to a conventional SOI wafer except that silicon layer 56 is preferably thinner than the semiconductor layer on a conventional SOI wafer. For example, silicon layer 56 is preferably about 20nm or even less. This can be achieved in a conventional SOI substrate by oxidizing the semiconductor surface of a conventional SOI substrate and then removing the oxide. The thickness can be quite thin because its purpose is as a seed layer. It may be thicker than the minimum but because it will be part of the channel, it should still be sufficiently thin to allow sufficient channel control, especially to avoid excessive off-state leakage.

Figure 8:
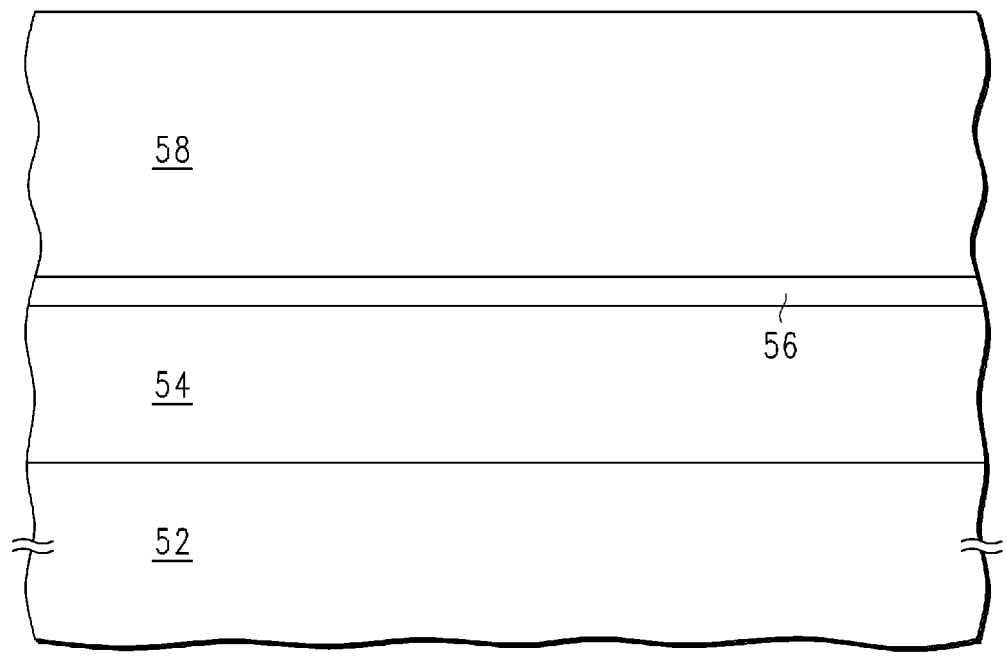
FIG. 8 is a cross section of the semiconductor device of FIG. 7 at a subsequent stage in processing.

Shown in FIG. 8 is semiconductor device 50 after growing a SiGe layer 58 on silicon layer 56. The height of SiGe layer 58 is the desired height of the fins that will be subsequently formed, which is about 100 nm but could be another height. This structure of semiconductor device 50 shown in FIG. 8 may also be directly available commercially from a vendor who may make it by this or another process such as layer transfer.

Figure 9:
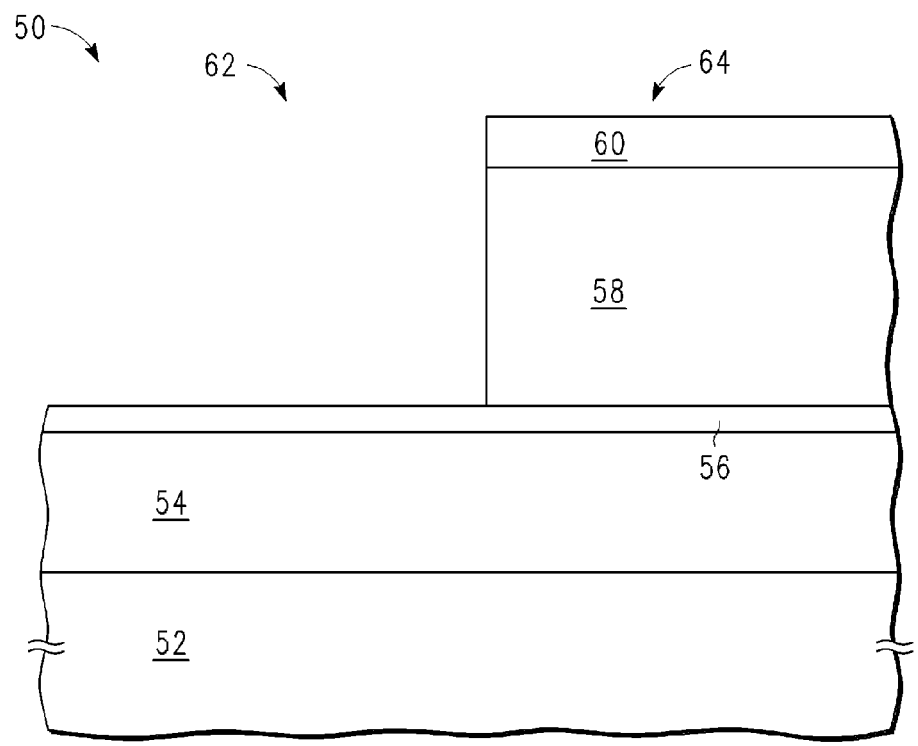
FIG. 9 is a cross section of the semiconductor device of FIG. 8 at a subsequent stage in processing.

Shown in FIG. 9 is semiconductor device 50 after forming a capping layer 60, preferably of oxide, over SiGe layer 58 and then removing a portion of SiGe layer 58 and capping layer 60. The removed portion is from a region 62 for forming planar transistors and the remaining portion of SiGe layer 58 is in a region 64 for forming fin transistors (finFETs). Silicon layer 56 is exposed in region 62.

Figure 10:
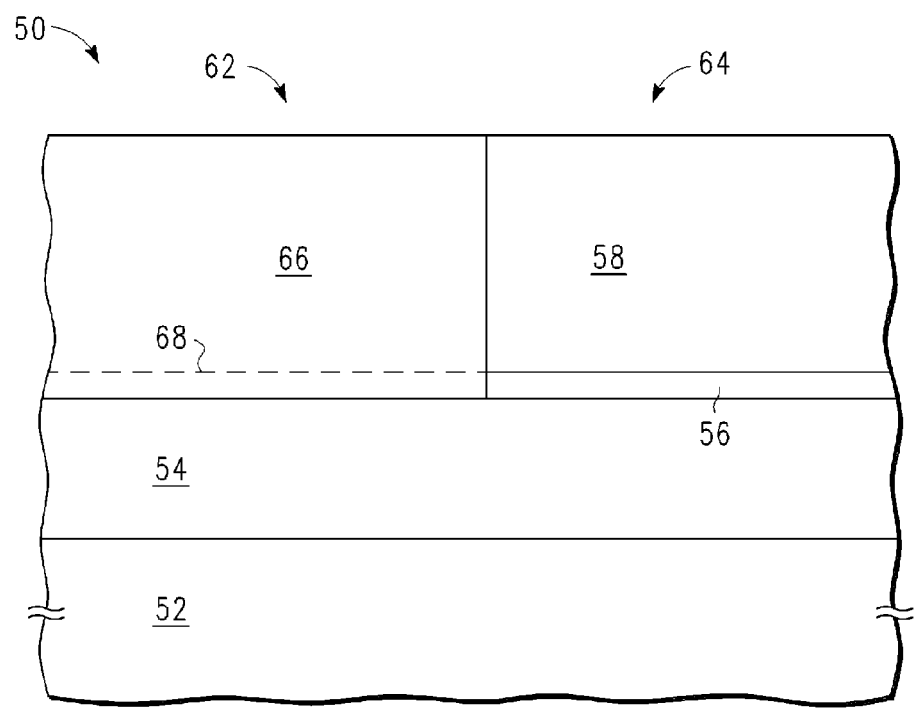
FIG. 10 is a cross section of the semiconductor device of FIG. 9 at a subsequent stage in processing.

Shown in FIG. 10 is semiconductor device 50 after selectively growing epitaxial silicon on silicon layer 56 to form an epitaxial layer 66 that will function as the body for planar transistors and then removing capping layer 60. Dotted line 68 shows the previous surface of silicon layer 56. Line 68 is dotted because the demarcation of silicon layer 56 would unlikely to be discernible after performing the epitaxial growth to form epitaxial layer 66.

Figure 11:
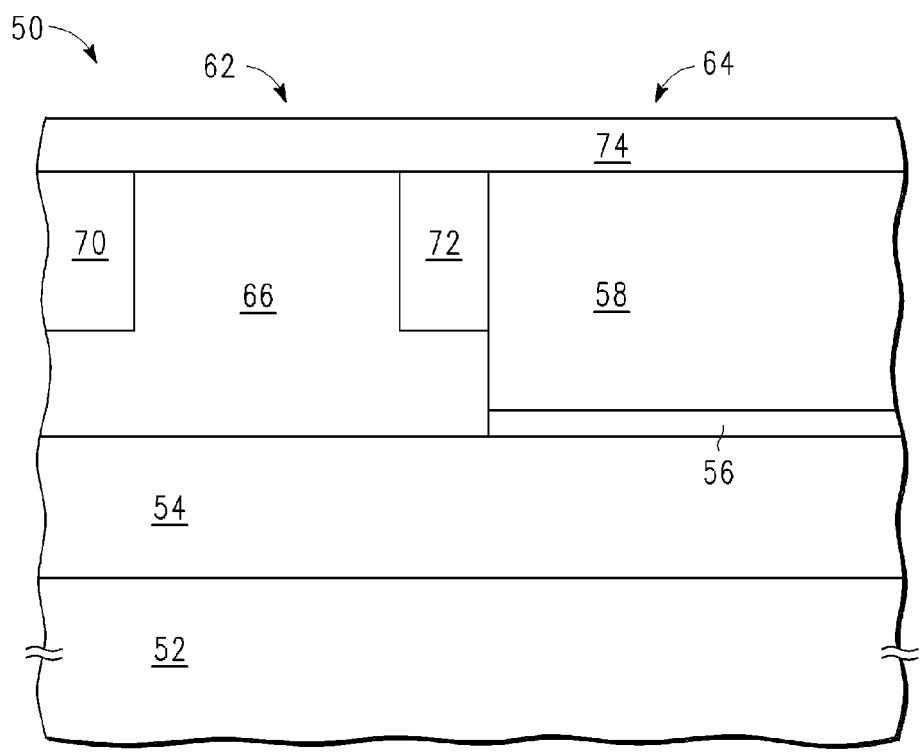
FIG. 11 is a cross section of the semiconductor device of FIG. 10 at a subsequent stage in processing.

Shown in FIG. 11 is semiconductor device 50 after forming isolation regions 70 and 72 in epitaxial layer 66 and forming a capping layer 74, preferably of nitride, over epitaxial layer 66, isolation regions 70 and 72, and SiGe layer 58. Capping layer 74 is preferably about 20-50 nm in thickness.

Figure 12:
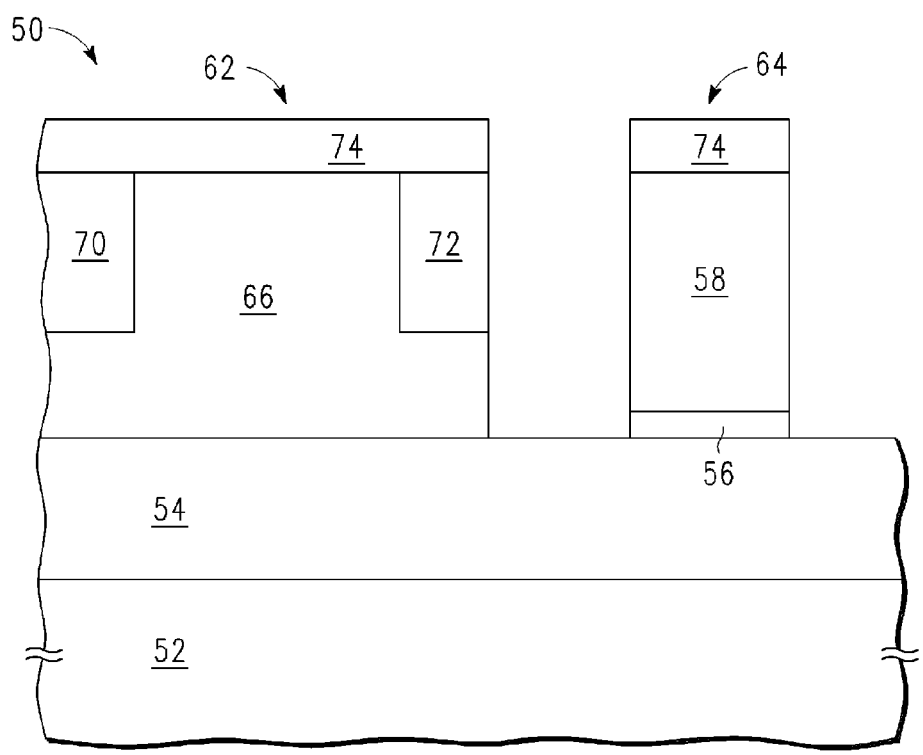
FIG. 12 is a cross section of the semiconductor device of FIG. 11 at a subsequent stage in processing.

Shown in FIG. 12 is semiconductor device 50 after performing a patterned etch through capping layer 74, SiGe layer 58, and silicon layer 56. This leaves a fin of SiGe similar to that of FIG. 1 and the dimensions may be the same. A difference is that SiGe layer 58 is over a silicon layer, silicon layer 56, whereas SiGe fin 16 is directly on an insulating layer. In this cross section of FIG. 12, only the fin portion of SiGe layer 58 is shown, but source/drain portions at the ends of the fin are present and covered by nitride layer 74.

Figure 13:
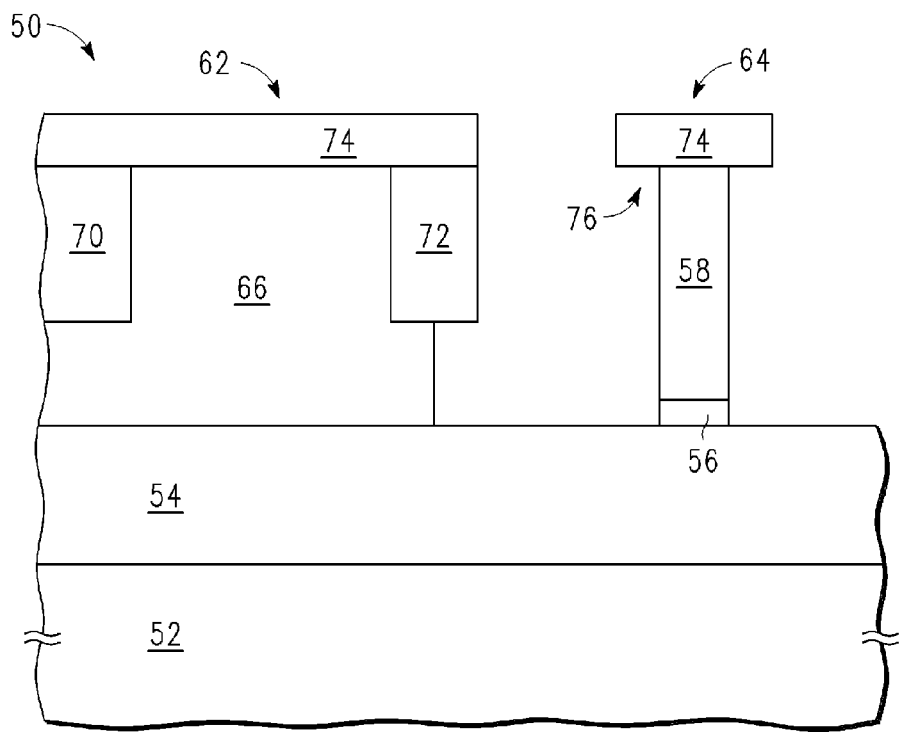
FIG. 13 is a cross section of the semiconductor device of FIG. 12 at a subsequent stage in processing.

Shown in FIG. 13 is semiconductor device 50 after trimming SiGe layer 58 and silicon layer 56. The trimming is the same as for the trimming shown in FIG. 2 except that both SiGe and silicon are being trimmed so if an isotropic etch is used, it preferably is not selective, or at least not significantly so, between silicon and SiGe. Capping layer 74 thus overhangs past the sides of trimmed SiGe layer and silicon layer 56 by an overhang 76. The trimming is symmetrical so capping layer 74 overhangs on both sides. The trim also etches the side of epitaxial layer 66.

Figure 14:
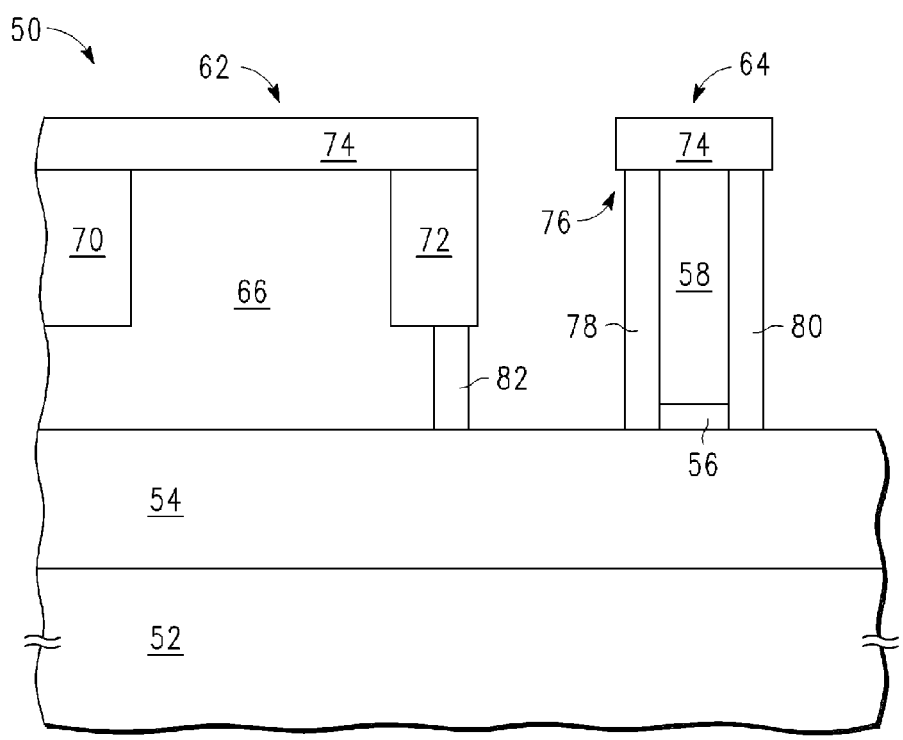
FIG. 14 is a cross section of the semiconductor device of FIG. 13 at a subsequent stage in processing.

Shown in FIG. 14 is semiconductor device 50 after silicon fins 78 and 80 are selectively epitaxially grown on the sides of SiGe layer 58 and silicon layer 56, and silicon fill 82 is simultaneously grown on the side of epitaxial layer 66. These silicon fins 78 and 80 are formed the same as described for silicon fins 22 and 24 of FIG. 3 except for the growth from silicon layer 56. Thus, silicon fins 78 and 80 are formed at about 20% of the width of the SiGe layer 58 of FIG. 12. As described relative to FIG. 3, the result is that for every sacrificial SiGe fin, there are two silicon fins. The width of 58 sacrificial SiGe layer is of a width to achieve the desired width and spacing for silicon fins 78 and 80. The spacing of the SiGe fins is preferably the minimum spacing. Thus if the SiGe fins are at the minimum spacing, also commonly called minimum pitch, the density is doubled from what the minimum pitch would normally provide by having two silicon fins per sacrificial SiGe fin. The lines between silicon layer 56 and silicon fins 78 and 80 are unlikely to be visible due to they are the same material and silicon fins 78 and 80 are epitaxially grown.

Figure 15:
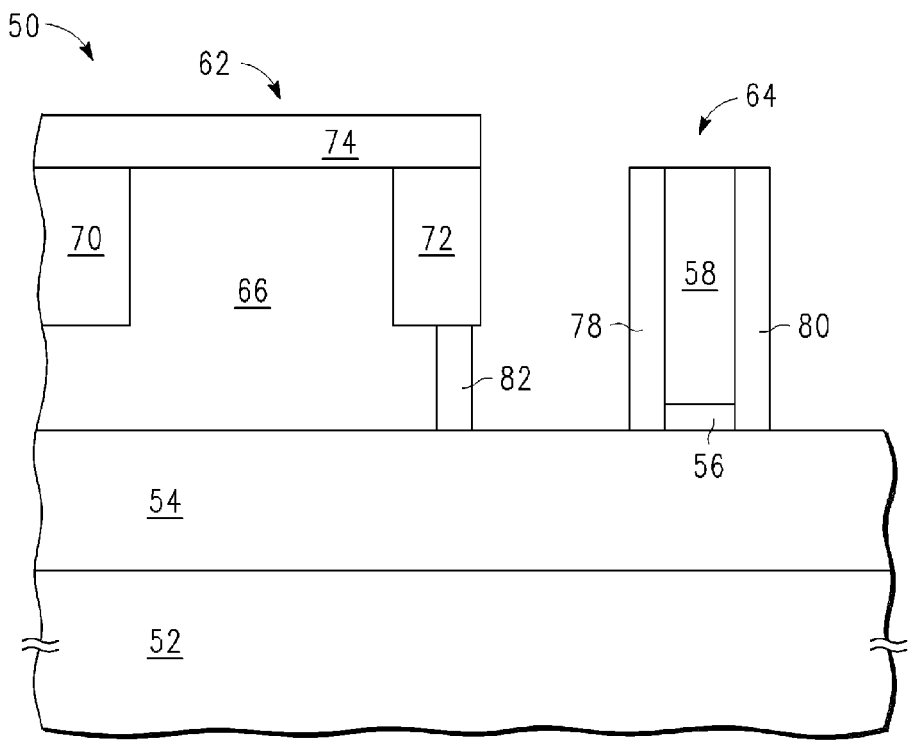
FIG. 15 is a cross section of the semiconductor device of FIG. 14 at a subsequent stage in processing.

Shown in FIG. 15 is semiconductor device 50 after removing capping layer 74 over the fin portion of SiGe layer 58, which is in region 64. The portions of capping layer 74 over region 62 and over the source/drain regions (not shown) are not removed at this time.

Figure 16:
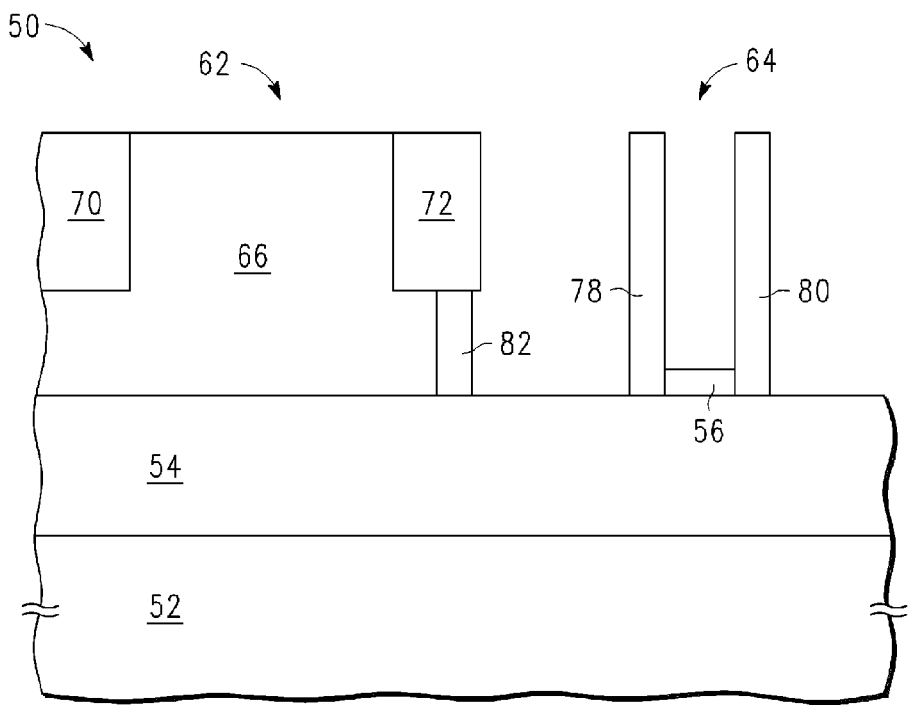
FIG. 16 is a cross section of the semiconductor device of FIG. 15 at a subsequent stage in processing.

Shown in FIG. 16 is semiconductor device 50 after removing the fin portion of SiGe layer 58. The source/drain regions are not removed because they are still capped by capping layer 74. The resulting structure has fins 78 and 80 with silicon layer 56 between them. The removing of SiGe is selective to silicon. An etch chemistry that is effective for this purpose is thermal gaseous HCl. Other selective etches include plasma fluorine chemistries or peroxide wet etches. Capping layer 74 over region 62 and over the source/drains is removed after the SiGe fin portion is removed.

Figure 17:
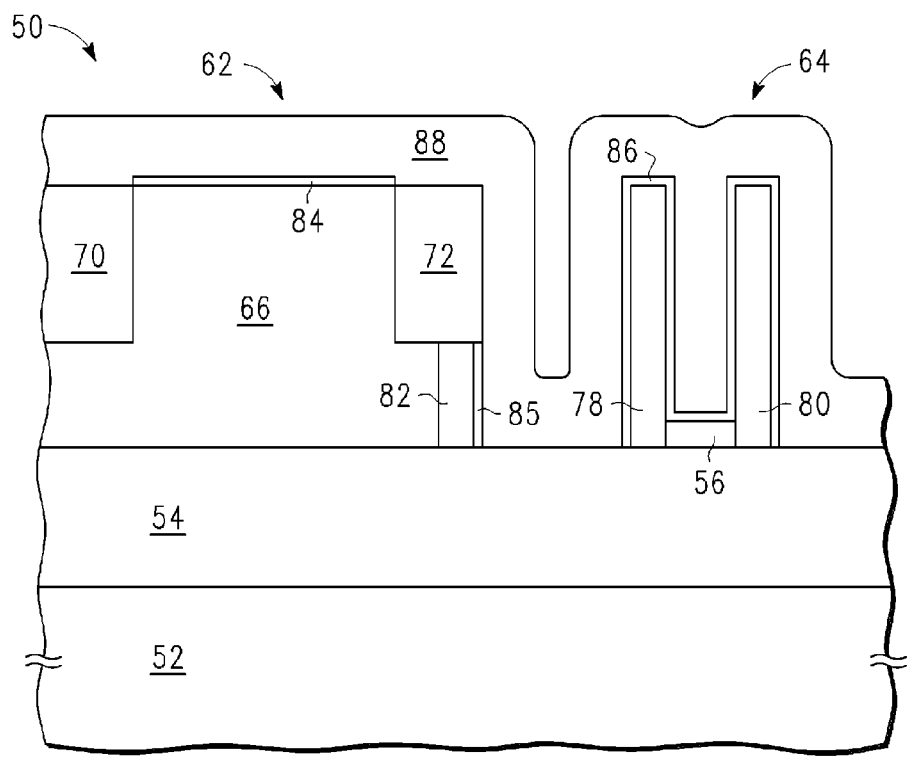
FIG. 17 is a cross section of the semiconductor device of FIG. 16 at a subsequent stage in processing.

Shown in FIG. 17 is semiconductor device 50 after forming a gate dielectric 84 on epitaxial layer 66, a gate dielectric layer 85 on the side of silicon fill 82, a gate dielectric layer 86 on silicon fins 78 and 80 and silicon layer 56, and a polysilicon layer 88 after forming gate dielectrics 84 and 86. As shown gate dielectrics 84 and 86 are preferably thermally grown oxide. An alternative would be to use another type of gate dielectric such as a high k dielectric such as hafnium oxide. In such case the gate dielectric would be deposited over all of the surfaces shown in FIG. 17 before the formation of polysilicon layer 88. Polysilicon layer 88 could be replaced by another gate electrode material other than polysilicon or in addition to polysilicon.

Figure 18:
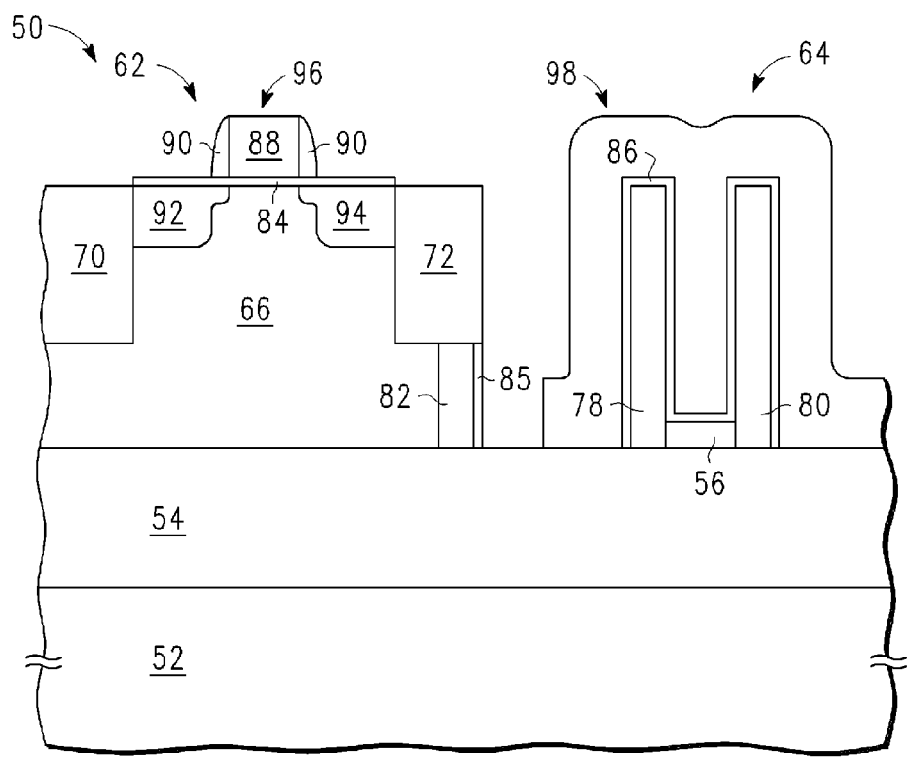
FIG. 18 is a cross section of the semiconductor device of FIG. 17 at a subsequent stage in processing.

Shown in FIG. 18 is semiconductor device 50 after patterning polysilicon layer 88 and forming a transistor 96 in region 62 and a transistor 98 in region 64. Transistor 96 is a planar transistor having a portion of polysilicon layer 88 as the gate, source/drains 92 and 94 in epitaxial layer 66, and sidewall spacer 90 around the gate.

Thus it is seen that there is an integration on the same substrate of an integrated circuit of a planar transistor and a finFET. This shows that this integration may be achieved while using the overhang to achieve the reduced faceting while achieving sublithographic pitch by having two silicon fins per sacrificial fin with the sacrificial fins being at the minimum pitch. Also the height of the planar transistor above insulating layer 54 is substantially the same as the height of the finFET. This is beneficial for subsequent processing.

Figure 19:
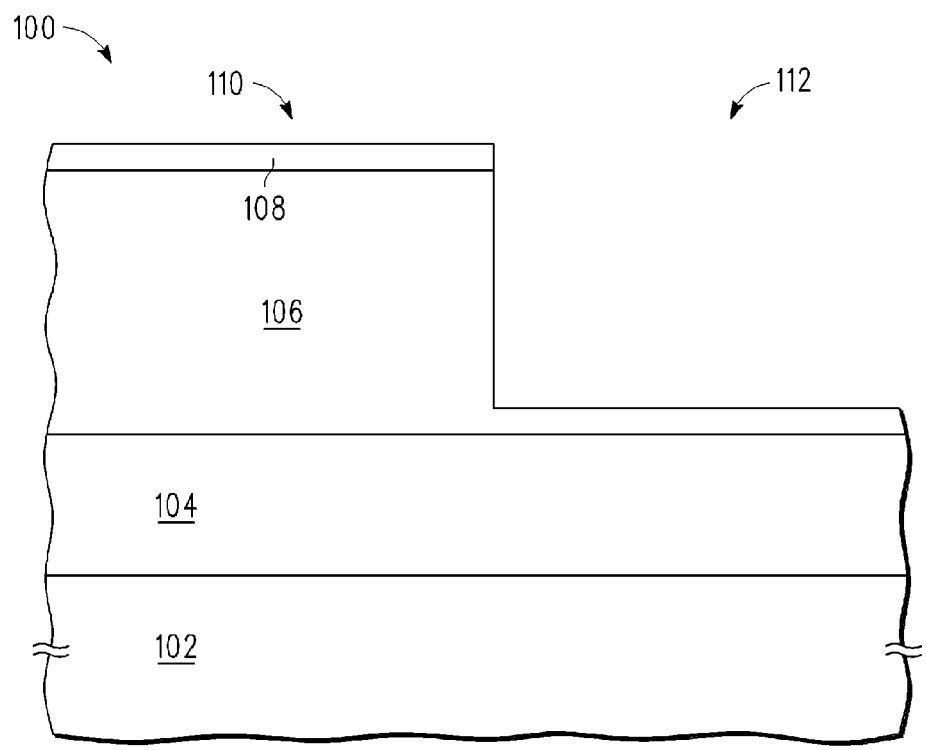
FIG. 19 is a cross section of a semiconductor device at stage in processing for an alternative to a obtaining a semiconductor device similar to that of FIG. 10.

Shown in FIG. 19 is a semiconductor device 100 comprising a substrate 102, an insulating layer 104, a silicon layer 106 that has been patterned, and a capping layer 108. Silicon layer 106 has a region 110 for planar transistors and a region 112 for forming finFETs. Silicon layer 106 has a height in region 110 that is about the same as the desired fin height and a height that is sufficient to function as a seed for SiGe epitaxial growth in region 112. This reduced height for silicon layer 106 in region 112 is achieved by a timed etch.

Figure 20:
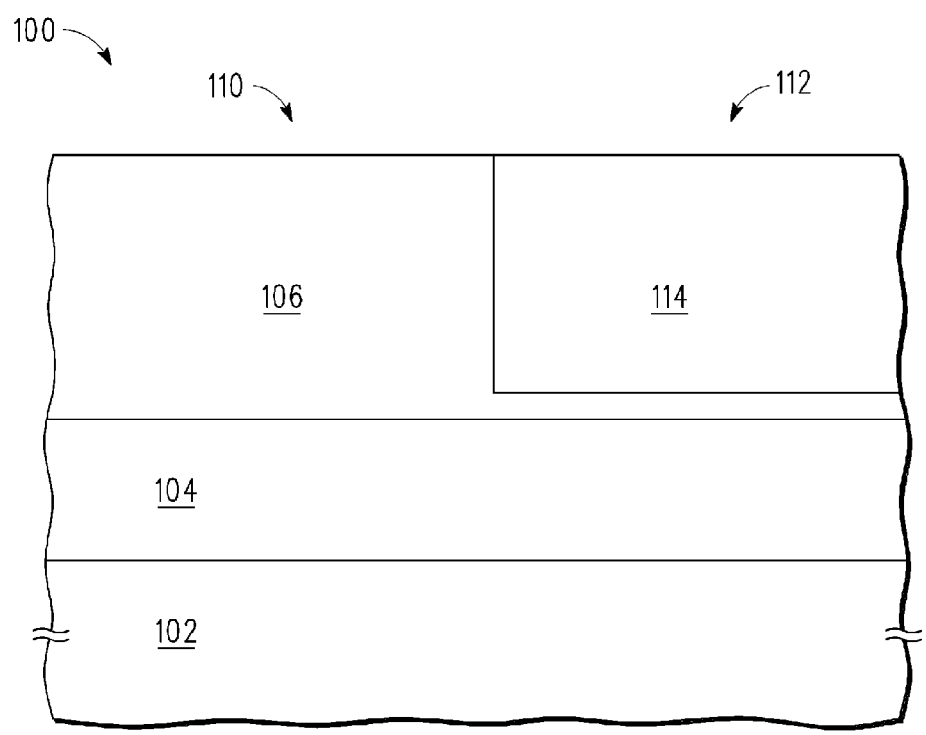
FIG. 20 is a cross section of the semiconductor device of FIG. 19 at a subsequent stage in processing.

Shown in FIG. 20 is semiconductor device 100 after epitaxially growing a SiGe layer 114 over silicon layer 106 in region 112 while capping layer 108 is present and then removing capping layer 108. This achieves the structure of FIG. 10. The process continues as described for FIGS. 11-18. This shows there are multiple techniques available to achieve the structure of FIG. 10.

Although the invention is described herein with reference to specific embodiments, various modifications and changes can be made without departing from the scope of the present invention as set forth in the claims below. For example, different materials may be used than those described. For example, the sacrificial fin may be a different material than SiGe and the fins to be left remaining may be a different material than silicon. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor device comprising:
   removing portions of a sacrificial layer to expose a first seed layer region, wherein the first seed layer region corresponds to a first semiconductor region and a remaining portion of the sacrificial layer corresponds to a second semiconductor region;
   depositing an epitaxial semiconductor material over the first seed layer region;
   forming a capping layer overlying the epitaxial semiconductor material and the remaining portion of the sacrificial layer;
   removing portions of the capping layer to form a capping structure that overlies a part of the remaining portion of the sacrificial layer;
   removing portions of the sacrificial layer not covered by the capping structure to form a sacrificial structure having sidewalls;
   forming fin structures adjoining the sidewalls by depositing a semiconductor material along the sidewalls;
   removing portions of the capping structure to expose portions of sacrificial layer between adjacent fin structures; and
   removing portions of the sacrificial material between the adjacent fin structures.

2. The method of claim 1 further comprising removing portions of a second seed layer region exposed as a result of removing portions of the sacrificial layer not covered by the capping structure after removing portions of the sacrificial layer not covered by the capping structure.

3. The method of claim 2 further comprising:
   forming a first gate dielectric layer over the adjacent fin structures;
   forming a first gate electrode layer over the first gate dielectric layer; and
   patterning the first gate electrode layer to form a first gate electrode that that extends over portions of the fin structures.

4. The method of claim 3 further comprising:
   forming a second gate dielectric layer over the first semiconductor region;
   forming a second gate electrode layer over the second gate dielectric layer; and
   patterning the second gate electrode layer to form a second gate electrode.

5. The method of claim 4, wherein the first gate dielectric layer and the second gate dielectric layer are a same dielectric layer.

6. The method of claim 4, wherein the first gate electrode layer and the second gate electrode layer are a same gate electrode layer.

7. The method of claim 4 further comprising recessing the sidewalls of the sacrificial structure relative to an edge of the capping structure prior to forming the fin structures.

8. A method for forming a semiconductor device comprising:
removing portions of a sacrificial layer to expose a first seed layer portion, wherein the first seed layer portion corresponds to a first semiconductor region and remaining portions of the sacrificial layer corresponds to a second semiconductor region;
depositing an epitaxial semiconductor material over the first seed layer portion;
forming a capping layer overlying the epitaxial semiconductor material and the remaining portions of the sacrificial layer;
removing a first portion of the capping layer to form a capping structure that overlies a remaining portion of the sacrificial layer;
removing portions of the sacrificial layer not covered by the capping structure to form a sacrificial structure having sidewalls;
removing portions of the sacrificial structure relative to an edge of the capping structure to recess the sidewalls and form recessed sidewall portions;
forming fin structures adjacent the recessed sidewall portions;
removing a second portion of the capping structure to expose portions of the sacrificial structure between the fin structures; and
removing portions of the sacrificial structure between the fin structures.

9. The method of claim 8 further comprising removing portions of a second seed layer region exposed as a result of removing portions of the sacrificial layer not covered by the capping structure after removing portions of the sacrificial layer not covered by the capping structure.

10. The method of claim 1 further comprising:
forming a first gate dielectric layer over the adjacent fin structures;
forming a first gate electrode layer over the first gate dielectric layer; and
patterning the first gate electrode layer to form a first gate electrode that that extends over portions of the fin structures.

11. The method of claim 9 further comprising:
forming a second gate dielectric layer over the first semiconductor region;
forming a second gate electrode layer over the second gate dielectric layer; and
patterning the second gate electrode layer to form a second gate electrode.

12. The method of claim 11, wherein the first gate dielectric layer and the second gate dielectric layer are a same dielectric layer.

13. The method of claim 11, wherein the first gate electrode layer and the second gate electrode layer are a same gate electrode layer.

14. A method for forming a semiconductor device comprising:
forming a cavity in a first region of a semiconductor layer by removing less than a full thickness of the semiconductor layer, wherein remaining portions of the semiconductor layer form a seed layer;
forming a sacrificial epitaxial semiconductor material over the seed layer;
forming a capping layer that overlies the sacrificial epitaxial semiconductor material and remaining portions of the semiconductor layer;
removing portions of the capping layer to define a capping structure that overlies portions of the sacrificial epitaxial semiconductor material;
removing portions of the sacrificial epitaxial semiconductor material not covered by the capping structure to form a sacrificial structure having sidewalls;
forming fin structures adjacent sidewalls of the sacrificial structure;
removing portions of the capping structure to expose portions of sacrificial structure between the fin structures; and
removing portions of the sacrificial structure in regions between the fin structures.

15. The method of claim 14 further comprising:
forming a first gate dielectric layer over the fin structures;
forming a first gate electrode layer over the first gate dielectric layer; and
patterning the first gate electrode layer to form a first gate electrode that that extends over portions of the fin structures.

16. The method of claim 15 further comprising:
forming a second gate dielectric layer over the region of the semiconductor layer outside of the first region;
forming a second gate electrode layer over the second gate dielectric layer;
patterning the second gate electrode layer to form a second gate electrode.

17. The method of claim 16, wherein the first gate dielectric layer and the second gate dielectric layer are a same dielectric layer.

18. The method of claim 16, wherein the first gate electrode layer and the second gate electrode layer are a same gate electrode layer.

19. The method of claim 16, wherein the semiconductor layer is further characterized as a single crystal silicon semiconductor layer.

20. The method of claim 16 further comprising recessing sidewalls of the sacrificial structure relative to an edge of the capping structure prior to forming the fin structures.

* * * * *